(12) United States Patent
Li et al.

(10) Patent No.: US 10,848,131 B1
(45) Date of Patent: Nov. 24, 2020

(54) LOW POWER LATTICE WAVE FILTER SYSTEMS AND METHODS

(71) Applicant: SYNAPTICS INCORPORATED, San Jose, CA (US)

(72) Inventors: Jacky Li, Chengdu (CN); Jens Kristian Poulsen, Kitchener (CA); Hari Hariharan, Irvine, CA (US)

(73) Assignee: SYNAPTICS INCORPORATED, San Jose, CA (US)

( * ) Notice: Subject to any disclaimer, the term of this patent is extended or adjusted under 35 U.S.C. 154(b) by 0 days.

(21) Appl. No.: 16/425,813

(22) Filed: May 29, 2019

(51) Int. Cl.
*H03H 17/04* (2006.01)
*H03H 17/06* (2006.01)

(52) U.S. Cl.
CPC ...... *H03H 17/045* (2013.01); *H03H 17/0444* (2013.01); *H03H 17/0628* (2013.01)

(58) Field of Classification Search
CPC ............. H03H 17/045; H03H 17/0444; H03H 17/0628
See application file for complete search history.

(56) References Cited

U.S. PATENT DOCUMENTS

| 5,325,318 | A | * | 6/1994 | Harris | H03H 17/045 708/313 |
| 8,521,798 | B2 | * | 8/2013 | Swan | H03H 17/04 708/300 |
| 2002/0012389 | A1 | * | 1/2002 | Wildhagen | H03H 17/0277 375/229 |
| 2005/0228840 | A1 | * | 10/2005 | Wang | H03H 17/0201 708/318 |
| 2008/0240467 | A1 | * | 10/2008 | Oliver | H03G 5/005 381/103 |

* cited by examiner

*Primary Examiner* — Jaison Joseph
(74) *Attorney, Agent, or Firm* — Haynes and Boone, LLP

(57) ABSTRACT

Systems and methods for low power lattice wave filters include an input operable to receive a digital input signal having a first sample rate, a first processing branch including a first delay element operable to receive the digital input signal and output a delayed digital input signal, a second processing branch including a first adder operable to receive the digital input signal and subtract a delayed feedback signal to produce a difference signal, a second adder operable to combine the delayed digital input signal and the difference signal to produce an output signal, and wherein the second processing branch further includes a feedback path including a second delay element operable to receive the output signal and output the delayed feedback signal. In a multistage topology, a register is disposed between each stage and clocked to reduce ripple power.

19 Claims, 10 Drawing Sheets

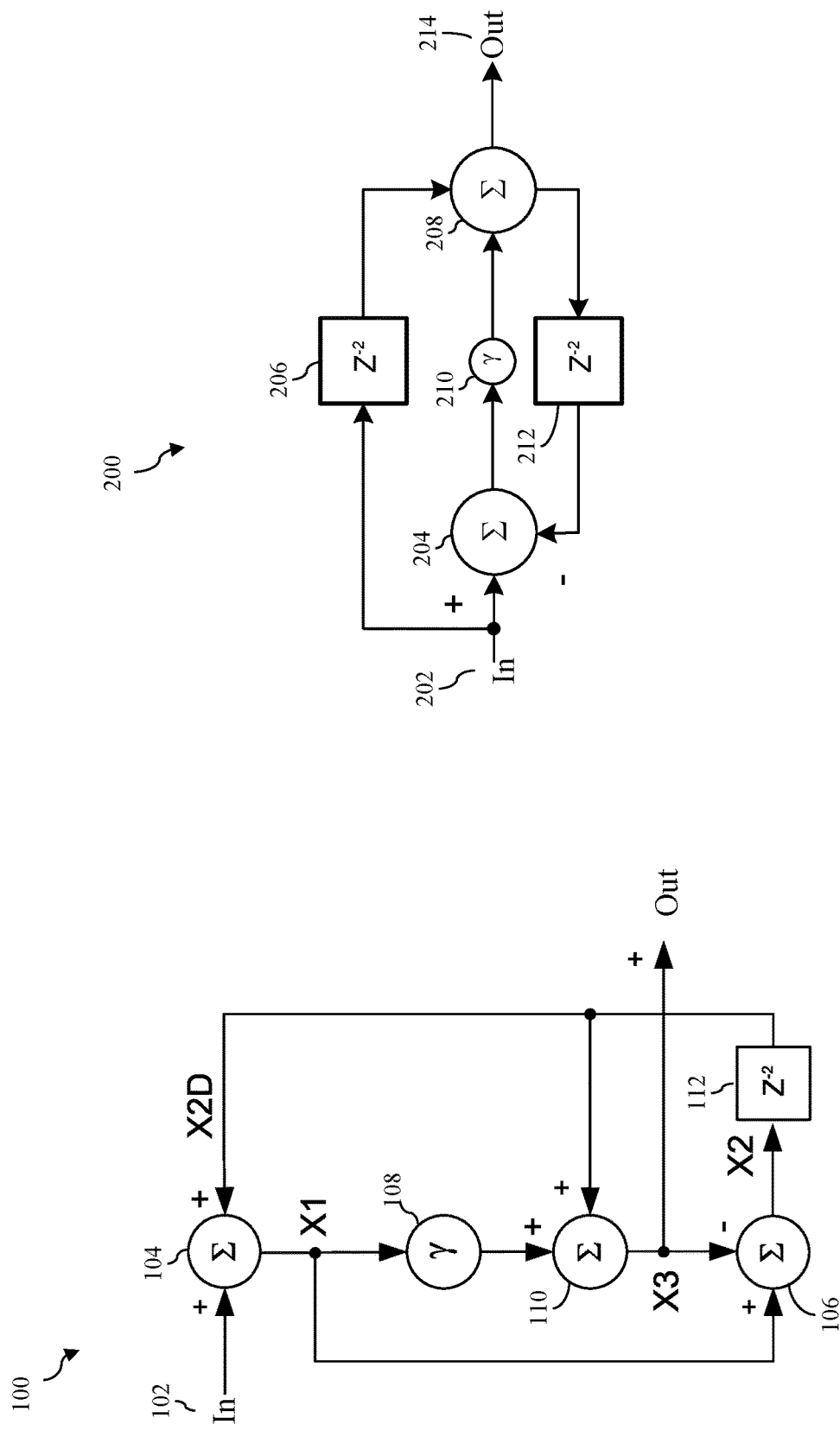

LOW POWER LATTICE WAVE FILTER SYSTEMS AND METHODS

TECHNICAL FIELD

The present application relates generally to systems and methods for digital signal processing, and more particularly to sample rate conversion of digital samples, for example, in adaptive noise cancellation systems.

BACKGROUND

The conversion of digital signals to different sample rates suitable for various digital components and processes is well known. Digital signal processing systems use different sampling rates in various system components depending on a desired signal quality, noise density, required bandwidth, latency requirements, processing economy, available silicon area and other considerations. In conventional systems, cascaded integrator-comb (CIC), finite impulse response (FIR) and infinite impulse response (IIR) filters have been used to perform sample rate conversion, typically in multiple stages to save power, e.g., each successive stage will use a lower or higher sampling rate depending on whether the operation is decimation or interpolation. There is a continued need to lower the power consumption of sample rate conversion structures, lower delays within sample rate conversion structures, and lower the required silicon area for implementing sample rate conversion structures.

SUMMARY

In accordance with various embodiments, systems and methods disclosed herein provide low power lattice wave filters. Sample rate conversion of digital signals using the disclosed low power lattice wave filters may be used in a variety of applications, e.g., in oversampled data converters or for bridging between systems utilizing different sampling rates. The lattice wave filter solutions disclosed herein have lower silicon footprint as compared to conventional solutions, and also have lower power consumption and enable efficient changes in the coefficients.

In some embodiments, systems and methods for low power lattice wave filters include an input operable to receive a digital input signal having a first sample rate, a first processing branch including a first delay element operable to receive the digital input signal and output a delayed digital input signal, a second processing branch including a first adder operable to receive the digital input signal and subtract a delayed feedback signal to produce a difference signal, a second adder operable to combine the delayed digital input signal and the difference signal to produce an output signal, and wherein the second processing branch further includes a feedback path including a second delay element operable to receive the output signal and output the delayed feedback signal. In a multistage topology, a register may be disposed between each stage and clocked to reduce ripple power.

The scope of the invention is defined by the claims, which are incorporated into this section by reference. A more complete understanding of embodiments of the invention will be afforded to those skilled in the art, as well as a realization of additional advantages thereof, by a consideration of the following detailed description of one or more embodiments. Reference will be made to the appended sheets of drawings that will first be described briefly.

BRIEF DESCRIPTION OF THE DRAWINGS

Aspects of the disclosure and their advantages can be better understood with reference to the following drawings and the detailed description that follows. It should be appreciated that like reference numerals are used to identify like elements illustrated in one or more of the figures, wherein showings therein are for purposes of illustrating embodiments of the present disclosure and not for purposes of limiting the same. The components in the drawings are not necessarily to scale, emphasis instead being placed upon clearly illustrating the principles of the present disclosure.

FIG. 1 illustrates a conventional fifth order lattice wave filter.

FIG. 2 illustrates a section of a lattice wave filter, in accordance with one or more embodiments of the present disclosure.

DETAILED DESCRIPTION

Figure 3:
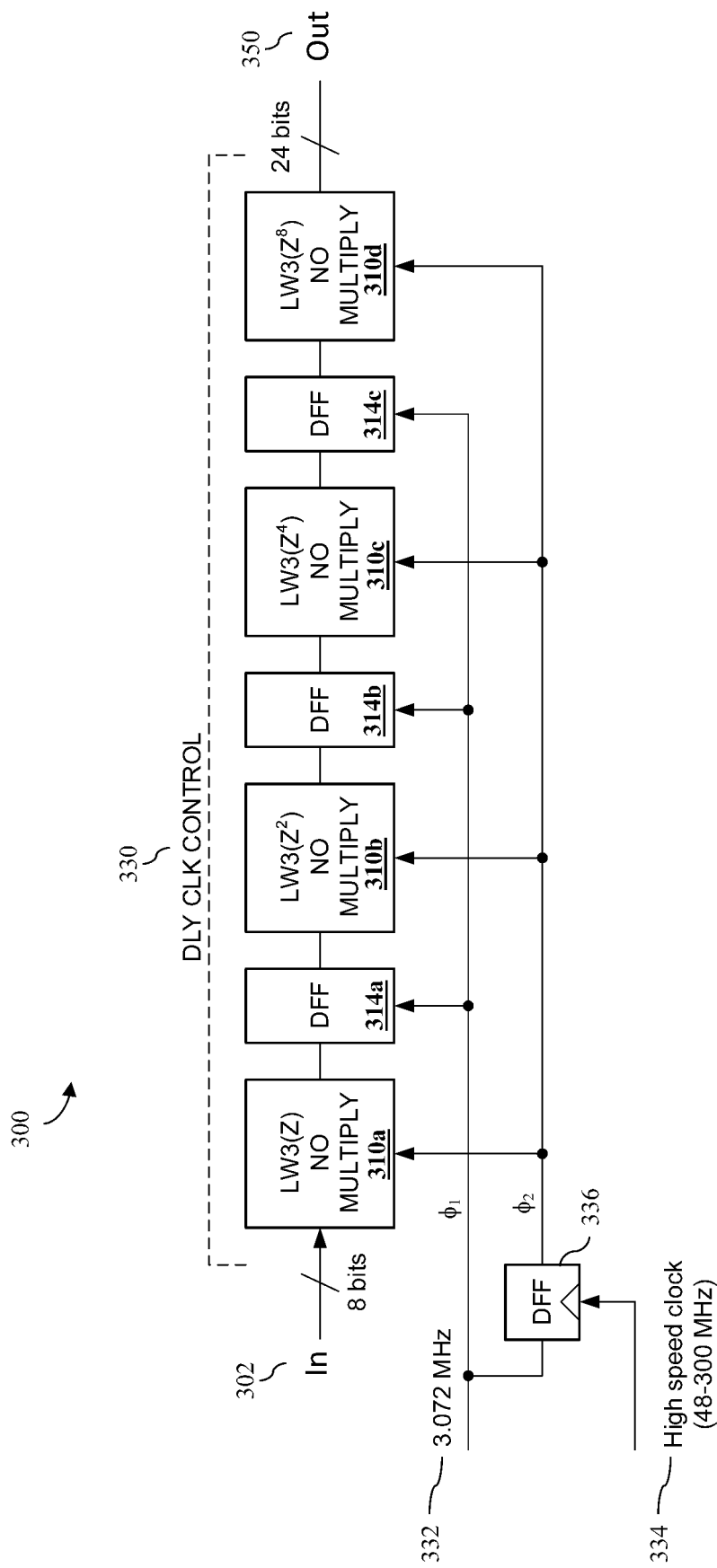
FIG. 3 illustrates an example lattice wave filter including multiple delays inside the filters to reduce ripple power, in accordance with one or more embodiments of the present disclosure.

In accordance with various embodiments, improved systems and methods for sample rate conversion of digital signals using low power lattice wave filters are disclosed. The embodiments disclosed herein may require a lower silicon footprint as compared to previous solutions and may enable multiple sample rates to be processed within a single section. In some embodiments, lattice wave filters are disclosed that have lower power consumption than conventional solutions and facilitate efficient changes in the coefficients. The lower power consumption may be due to a lower number of arithmetic operations, less toggling during changing of states and, in some embodiments, less register operations. The solutions disclosed herein may be fully compatible with existing structures and provide the same arithmetic range.

Lattice wave filters have a simple structure suited for decimation and interpolation. These filters have low sensitivity towards coefficient changes and thereby enable multiplication to be implemented with shorter coefficient length or be replaced by addition and subtraction using Canonic Signed Digit (CSD) logic. In various embodiments, a low power lattice wave filter comprises a new method of implementing the individual sections, thereby reducing the number of arithmetic operations. In some embodiments, multiple delays are provided inside the lattice wave filters to reduce ripple power. In other embodiments, a simplified high order lattice wave filter using a new topology is provided which reduces both power and silicon area is disclosed. In some embodiments, the lattice wave filter design is characterized by simplified use of registers that saves on adders and registers in the system.

Referring to FIG. 1, a conventional reflector section of a general lattice wave filter 100 will now be described. The reflection section 100 receives a digital input signal at an input node 102, which is provided to a first adder 104 that combines the digital input signal with a feedback signal X2D to produce signal X1. X1 is provided to a subtractor 106 which subtracts a filtered signal X3 to produce a difference signal X2. The filtered signal X3 is produced by applying a filter coefficient 108 to signal X1 and adding the result to a delayed difference signal X2 by a second adder 110. The difference signal X2 is delayed by delay element 112, which delays the difference signal X2 by two samples. This structure is suited for bi-reciprocal lattice wave filters. In the general case, the delay may consist of one or more unit delays.

Referring to FIG. 2, an alternative approach for implementing individual sections of a lattice wave filter will now be described, in accordance with one or more embodiments of the present application. The illustrated embodiment provides many advantages over conventional systems, including reducing the number of arithmetic operations.

It is observed that a single section of a lattice wave filter has the transfer function:

$$Y/X=(\gamma+z^{-2})/(1+\gamma z^{-2}), \text{ or}$$

$$Y(1+\gamma z^{-2})=X(\gamma+z^{-2}), \text{ which can be simplified to}$$

$$Y=Xz^{-2}+\gamma(X-Yz^{-2}).$$

Based on this transfer function, an alternative topology is derived as illustrated in FIG. 2.

FIG. 2 illustrates a section of a low power lattice wave filter 200, in accordance with one or more embodiments of the present disclosure. An input 202 is configured to receive a digital data signal for sample rate conversion. The digital data signal is provided to a subtractor 204 on a first processing path that subtracts a feedback signal. The digital data signal is also provided to a second processing path that includes first delay element 206 (e.g., a z-transform component) configured to delay the digital data signal by two samples and output the delayed digital data signal to an adder 208. The adder 208 produces an output signal that is output through an output node 214 for further processing. The output signal is fed back through a second delay element 212 which is configured to provide a two sample delay and then subtracted from the input digital data signal by the subtractor 204. A filter coefficient 210 ($\gamma$) is applied to the difference signal and added to the delayed digital data signal by the adder 208 to produce the output signal. In a general case, the delay elements may include one or multiple unit delays.

As illustrated, the lattice wave filter 200 it uses two adders and four registers, which is a basic structure for an all-pass filter. In various embodiments, the lattice wave filter 200 includes two more registers, but one less adder. The registers may be replaced with a single register operating at half the input sample rate and the register output may be reused thereby reducing the original register requirements even further.

Referring to FIG. 3, an example lattice wave filter is illustrated including multiple delays inside the filters to reduce ripple power. As illustrated in FIG. 3, it is possible to reduce the power consumption of multiple oversampled interpolation or decimation filters by inserting registers between the stages thereby avoiding/reducing toggling at the output of the last section. Example filter structures are described in co-pending U.S. application Ser. No. 16/177, 308, filed Oct. 31, 2018, entitled LOW DELAY DECIMATOR AND INTERPOLATOR FILTERS, which is incorporated herein by reference. In some embodiments, it may be enough to include a single register in the middle as shown in the figure as register 314b, clocked on the opposite or a skewed clock edge, thereby reducing toggling considerably without increasing the latency of the entire filter. By including registers between multiple stages, the extra power consumption associated with multiple ripple carry operations can be significantly reduced.

As illustrated, a multistage lattice wave filter 300 includes an input node configured to receive a digital input signal 302. In this embodiment, the input signal is an 8-bit signal, but it will be appreciated that other input signals may be used. The input signal is passed through a series of lattice wave filters, including lattice wave filter 310a (N=1), lattice wave filter 310b (N=2), lattice wave filter 310c (N=4) and lattice wave filter 310d (N=8), where each stage increases the sample rate by a factor of two and N is the number of unit delay elements in the structure. To reduce power consumption of the multistage oversampled filters, a register is inserted between successive stages, thereby avoiding/reducing toggling at the output of the last section 310d. In the illustrated embodiment, each register is implemented as a D-type flip-flop (DFF), and includes DFF 314a, DFF 314b and DFF 314c. The lattice wave filters 310a-d and registers DFF 314a-c are controlled by a delay clock control 330. A clock signal 332 (3.072 MHz) provides the clock input for DFF 314a-c. A high speed clock 334 provides a clock input to a positive edge triggered DFF 336, which is also coupled to the clock signal 332, and provides clocking for the lattice wave filter stages 310a-310d. The output signal is provided to output node 350 for further processing.

Figure 4:
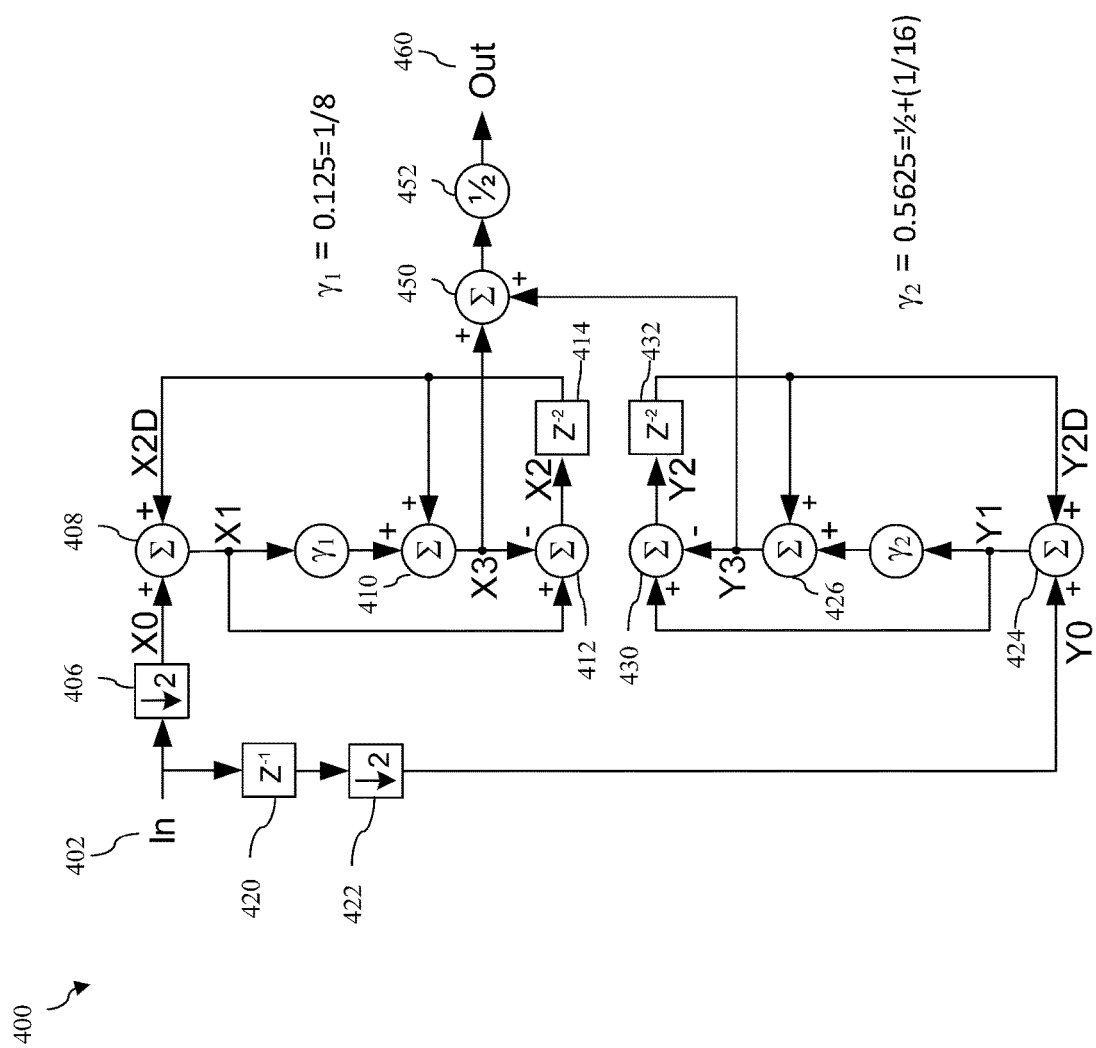
FIG. 4 illustrates an example fifth order lattice wave filter.

Referring to FIG. 4, an example fifth order bi-reciprocal lattice wave filter implemented as a decimation filter 400 will now be described. As illustrated, the decimation filter 400 receives a digital input signal at an input 402 of the decimation filter 400. The decimation filter 400 includes two data paths for processing the input digital stream. In a first processing path, the input digital stream is provided to a downsampler 406, which downsamples the input digital stream by a factor of two to produce an output X0. The signal X0 is combined with a feedback signal X2D through a first adder 408 producing a signal X1. Coefficient $\gamma_1$, which has a value of 1/8 (0.125) in the illustrated embodiment, is applied to X1 and the result is added by a second adder 410 to feedback signal X2D to produce output signal X3. X3 is subtracted from X1 by a subtractor. 412 to produce the difference signal X2. The difference signal X2 is delayed by a factor of two samples by a delay element 414 and fed back to the first adder 408 and the second adder 410.

In the second processing path, the input digital stream is fed to delay element 420, which delays the input digital stream by one sample and is downsampled by a factor of 2 by downsampler 422 to produce an output Y0. The signal Y0 is combined with a feedback signal Y2D through a third adder 424 producing signal Y1. Coefficient $\gamma_2$, which has a value of 1/16 plus one half (0.5625) in the illustrated embodiment, is applied to Y1 and the result is added by a fourth adder 426 to feedback signal Y2D to produce output signal Y3. Y3 is subtracted from Y1 by a second subtractor 430 to produce a difference signal Y2. The difference signal Y2 is delayed two samples through a delay element 432 and fed back to the third adder 424 and the fourth adder 426. The output signal X3 from the first processing path and output signal Y3 from the second processing path are combined by a fifth adder 450, fed through a divider 452 and to an output 460 (OUT).

Figure 5:
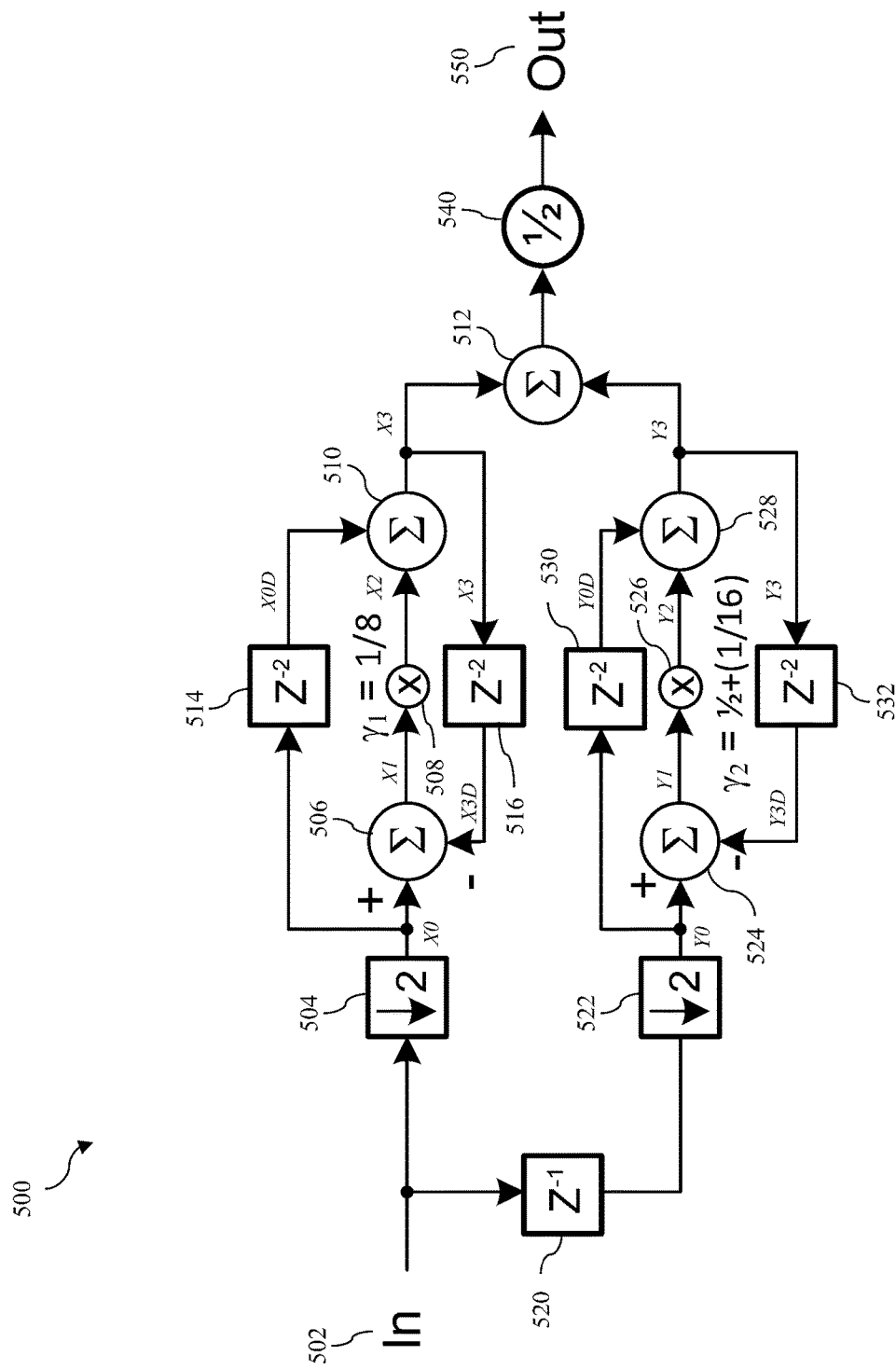
FIG. 5 illustrates an example fifth order lattice wave filter, in accordance with one or more embodiments of the present disclosure.

Referring to FIG. 5, an improved lattice wave filter will now be described in accordance with one or more embodiments of the present disclosure. As illustrated, a decimation filter 500 receives a digital input signal at an input 502 of the decimation filter 500. The decimation filter 500 includes two data paths for processing the input digital stream. In a first processing path, the input digital stream is provided to a downsampler 504, which downsamples the input digital stream by a factor of two to produce a downsampled signal X0. The signal X0 is combined with a feedback signal X3D through a subtractor 506 producing a signal X1. Coefficient $\gamma_1$, which has a value of ⅛ (0.125) in the illustrated embodiment, is applied to X1 by a component 508 to produce X2, which is provided to a first adder 510. The downsampled signal X0 is also provided to a delay element 514 that delays the signal by factor of two samples to produce a delayed signal X0D, which is combined with signal X2 by the first adder 510. The first adder 510 outputs a signal X3 to a second adder 512, and a copy of X3 is fed back to the first adder 506 through a delay element 516, which delays the signal X3 by a factor of two samples to produce feedback signal X3D.

In the second processing path, the input digital stream is fed to delay element 520, which delays the input digital stream by one sample, and is downsampled by a factor of two by downsampler 522 to produce an output Y0. The signal Y0 is combined with a feedback signal Y3D through a second subtractor 524 producing a signal Y1. Coefficient $\gamma_2$, which has a value of ⅛ (0.125) in the illustrated embodiment, is applied to Y1 by a component 526 to produce Y2, which is provided to a third adder 528. The downsampled signal Y0 is also provided to a delay element 530 that delays the signal by factor of two samples to produce a delayed signal Y0D, which is combined with signal Y2 by the third adder 528. The second subtractor 524 outputs a signal Y3 to the second adder 512, and a copy of Y3 is fed back to the second subtractor 524 through a delay element 532, which delays the signal Y3 by a factor of two samples to produce feedback signal Y3D. The output from the second adder 512 is provided to a divider 540 and then to an output 550 for further processing.

Figure 6A:
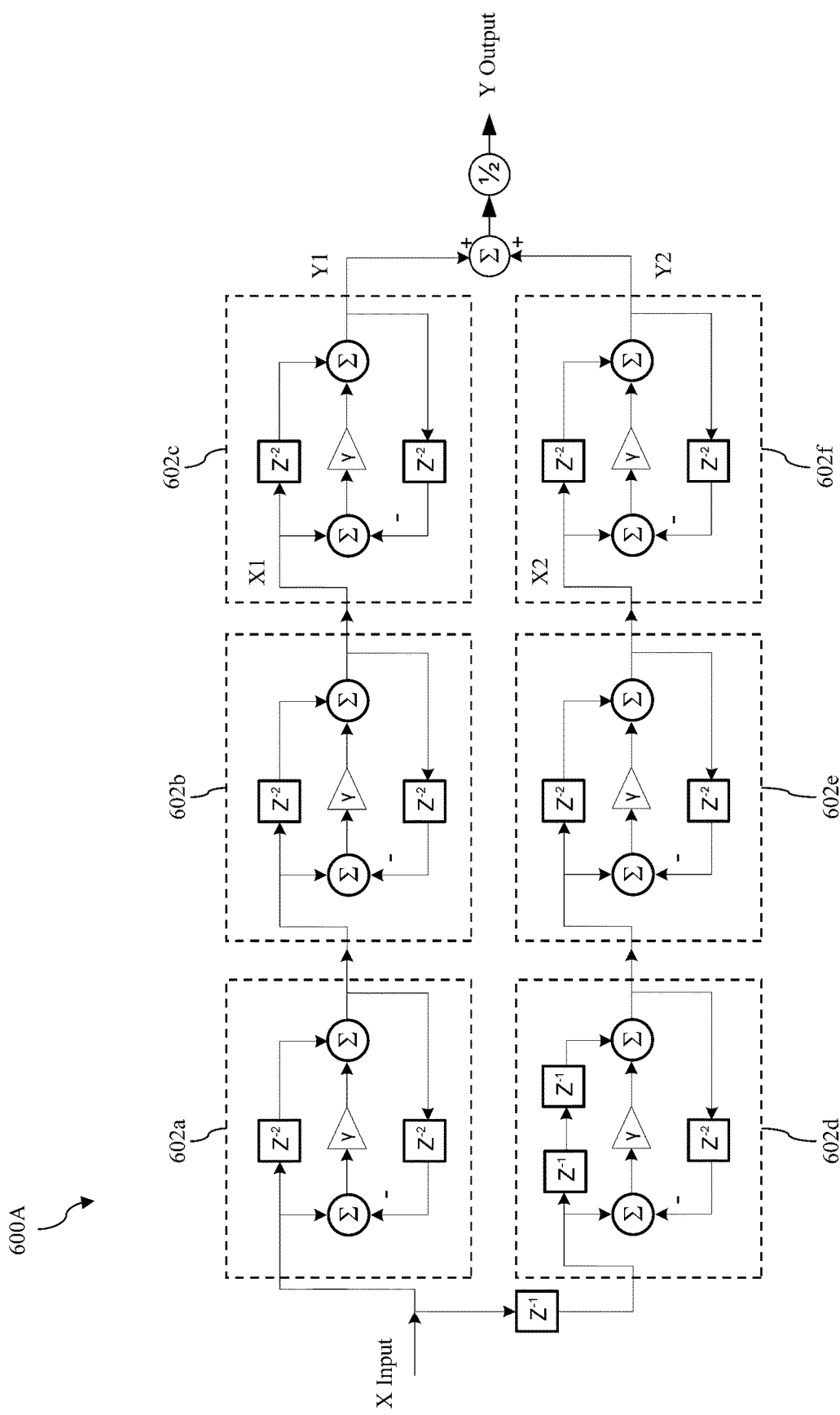
FIGS. 6A-D illustrate examples of thirteenth order lattice wave filters, in accordance with various embodiments of the present disclosure.

FIGS. 6A-D, illustrate examples of $13^{th}$ order lattice wave filter structures, in accordance with various embodiments of the present disclosure. Referring to FIG. 6A, a lattice wave filter 600A includes three reflector stages 602a-c on a first processing branch, and three reflector stages 602d-f on a second processing branch. The stages 602a-f may be implemented using the structures previously disclosed in FIGS. 2 and 5.

Figure 6B:
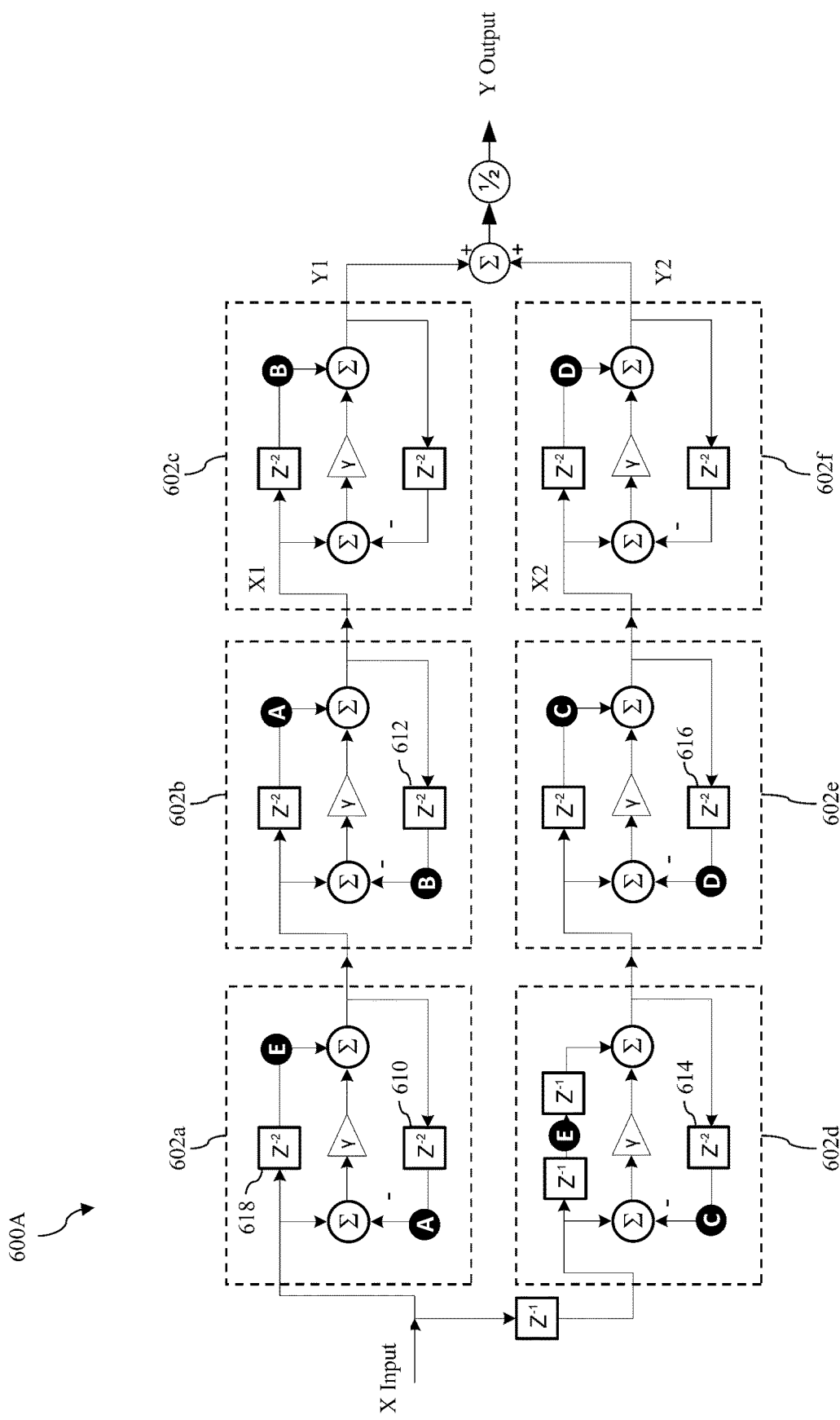
Figure 6C:
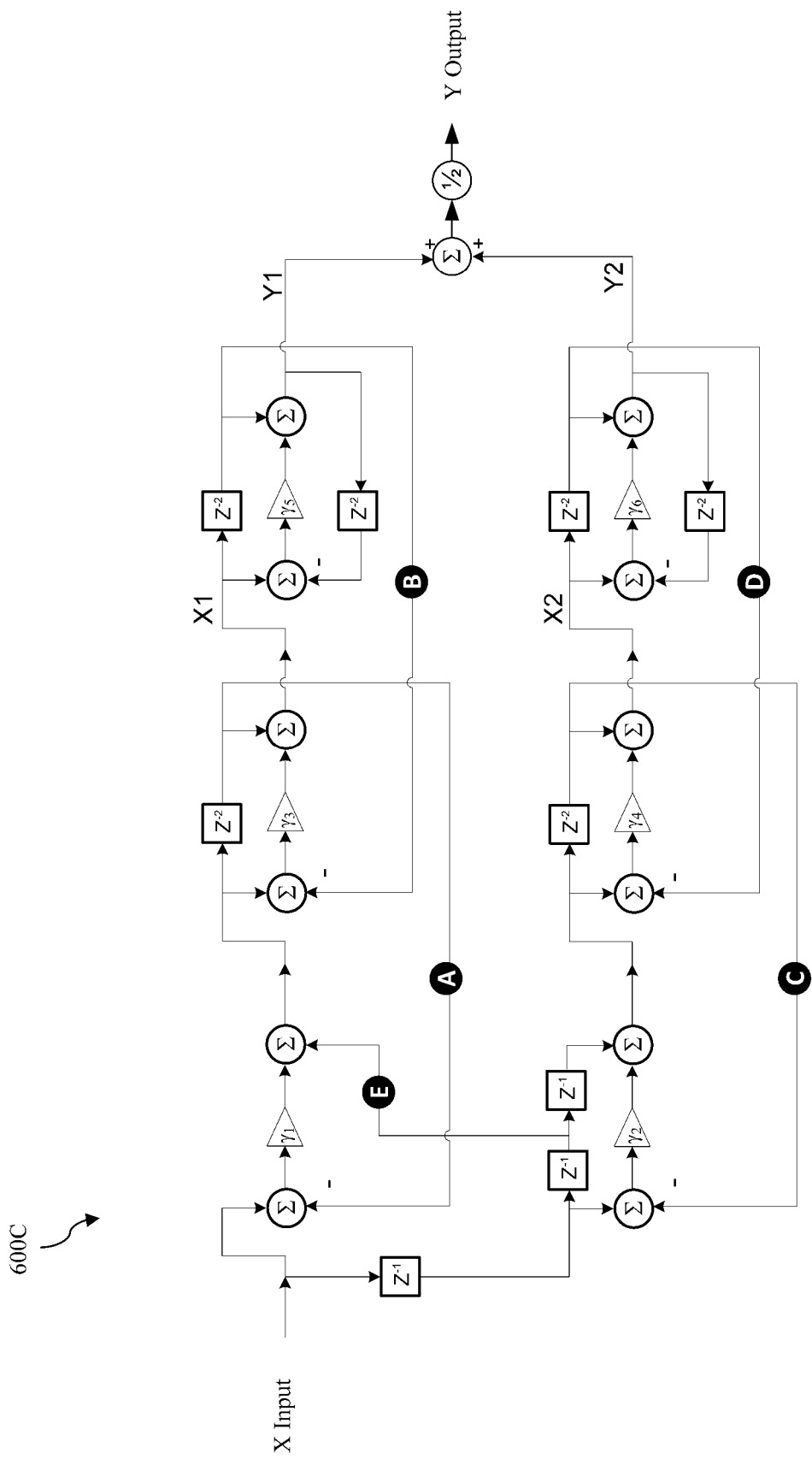

Referring to FIG. 6B, a further simplification of the $13^{th}$ order lattice wave filter 600A of FIG. 6A will now be described. It is observed that it is possible to reduce the registers and/or other components in lattice wave filter 600A. For example, some filter nodes have identical values allowing the elimination of certain registers that feed those nodes. It is observed, for example that (i) the output values (A) are identical allowing for the removal of delay element 610, (ii) the output values (B) are identical allowing for the removal of delay element 612, (iii) the output values (C) are identical allowing for the removal of delay element 614, (iv) the output values (D) are identical allowing for the removal of delay element 616, and (v) the output values (E) are identical, allowing for the removal of delay element 618. A simplified lattice wave filter 600C that eliminates the redundant delay elements is illustrated in FIG. 6C.

Figure 6D:
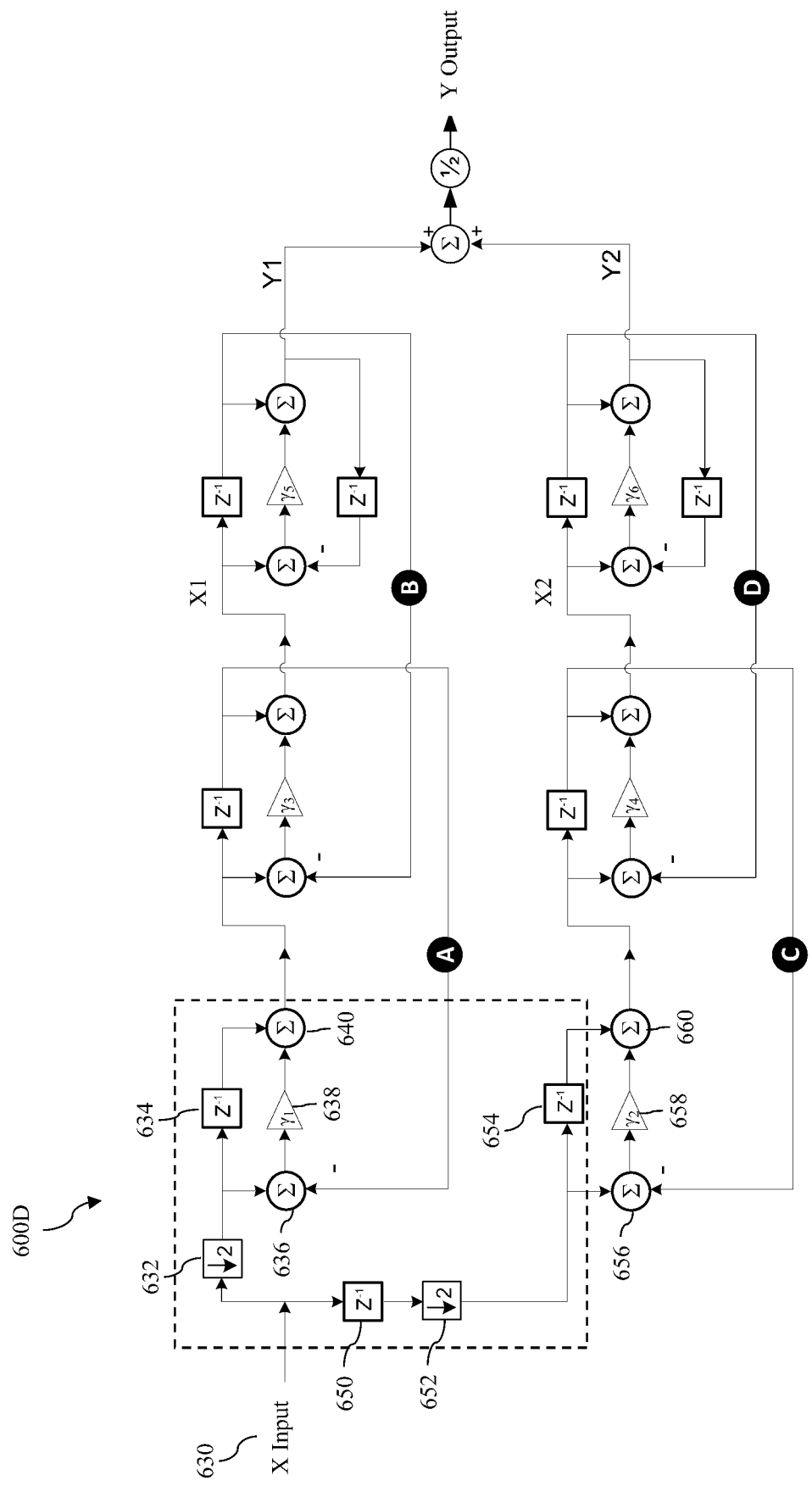

It is further observed that the output value (E) may further be eliminated as illustrated in FIG. 6D. FIG. 6D illustrates an embodiment of a simplified $13^{th}$ order lattice wave 600D. The lattice wave 600D receives an input signal 630 which is passed through two processing branches. In the first processing branch, the input signal 630 is downsampled by a factor of two by downsampler 632, and the downsampled input signal is provided to a delay element 634 and a first subtractor 636. The first subtractor 636 subtracts the feedback signal (A) received from the second stage from the downsampled input signal and produces a difference signal. The coefficient $\gamma_1$ is multiplied by the difference signal at a component 638 and the result is combined by a first adder 640 with the delayed downsampled input signal. The resulting output is then fed to the next stage.

In the second processing branch, the input signal 630 is delayed one sample by delay element 650 and is downsampled by a factor of two by downsampler 652. The delayed and downsampled input signal is provided to a delay element 654 and a second subtractor 656. The second subtractor 656 subtracts the feedback signal (C) received from the second stage from the delayed, downsampled input signal and produces a difference signal. The coefficient $\gamma_2$ is multiplied by the difference signal at a component 658 and the result is combined by a second adder 660 with the delayed, downsampled input signal, and the resulting output is fed to the next stage. It can be seen, that the number of delay elements has been reduced from 13 to 9 delay elements when comparing the original FIG. 6A to the new 6D. It is here assumed, that the delays are implemented using a single register operating at half the input sample rate to save register space and power.

The low power lattice wave filters disclosed herein may be used to facilitate sample conversion in a variety of multirate systems. For example, noise cancellation and noise reduction techniques are used in a variety of applications to improve user experiences in noisy environments. In one approach a listening device, such as headphones, headsets or ear buds, includes one or more audio sensors to pick up environmental noise and adaptive noise cancellation processing circuitry to generate an anti-noise signal to cancel or reduce the environmental noise for the user. It is desirable for the generated anti-noise signal to be equal to the inverse of the noise disturbance (thereby cancelling the noise) while desired audio, such as the playback from a high-fidelity audio source, is provided with minimal disturbance. To obtain desired attenuation of the environmental noise, ANC systems are designed for low latency processing of the received noise signals to generate an inverted output signal that has a minimal phase shift with respect to the original noise signal to obtain a wide bandwidth of noise cancellation.

In some embodiment, the low power lattice wave filters disclosed herein are used in noise cancellation systems that use oversampled converters in high-quality audio playback systems. In one embodiment, delta-sigma analog-to-digital converters (ADCs) and digital-to-analog converters (DACs) are used for audio signal processing. As compared to Nyquist sample rate converters, delta-sigma converters utilize a higher sample rate and are generally cheaper to implement because they require less precision in the analog signal components. Therefore, both from a cost and processing perspective, it is often advantageous to perform the noise cancellation at a higher sample rate than required by the Nyquist criterion and this can be used to obtain a wider noise cancellation bandwidth.

One complication with multi-rate signal processing is the possibility of increased latency. In ANC systems, it is desirable to provide a time-accurate reference for the active noise processing system, both of the measured noise (undesired signal) and high fidelity audio (desired signal), in order to generate an anti-noise signal that is in phase with the environmental noise to be cancelled. The low power lattice wave filters of the present disclosure have low sensitivity to coefficient changes and may be used to obtain low latency, even with higher filter order designs.

Figure 7:
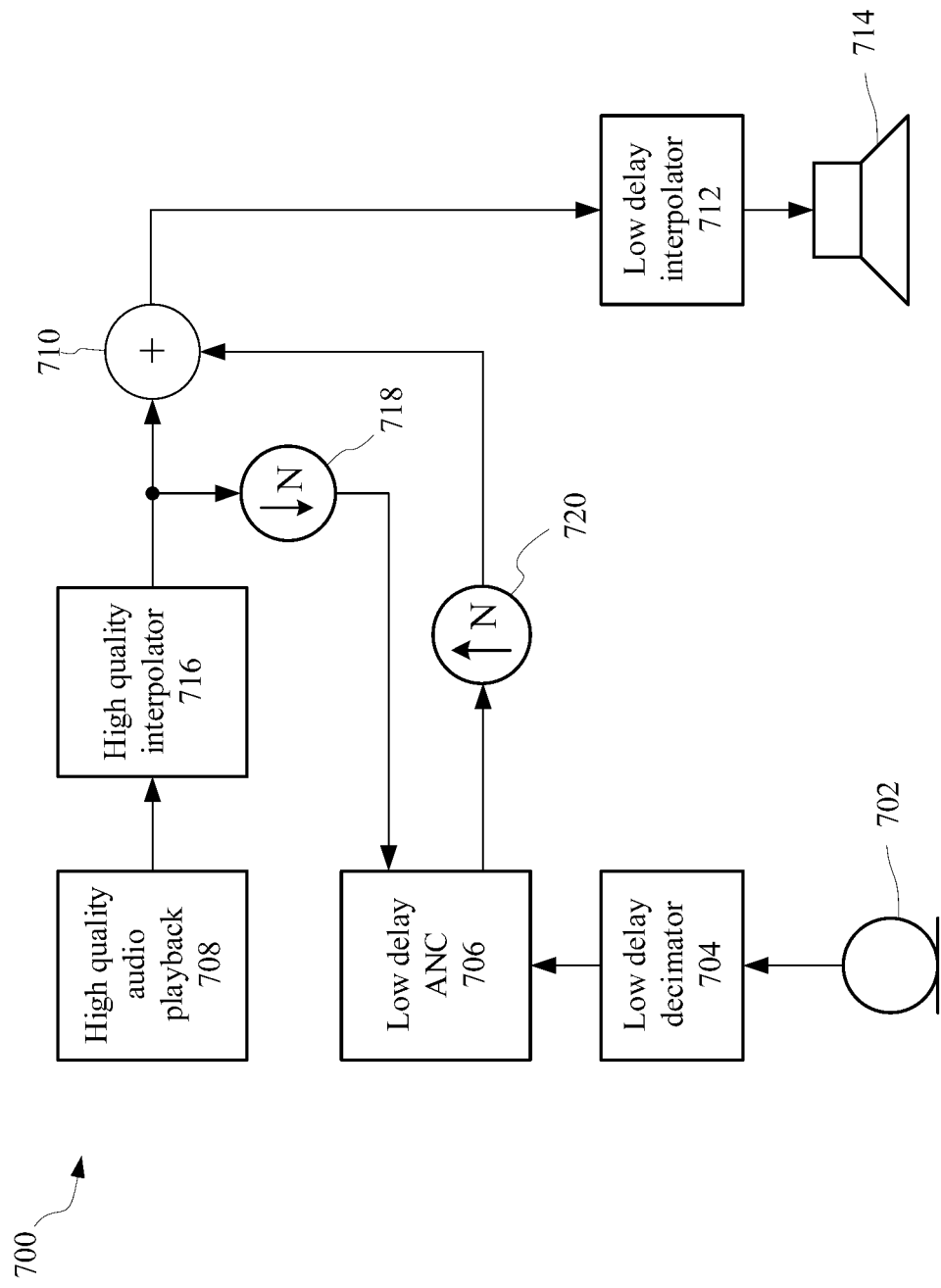
FIG. 7 illustrates an example adaptive noise cancellation system utilizing a low power lattice wave filter, in accordance with one or more embodiments of the present disclosure.

A system 700 for performing adaptive noise cancellation (ANC) in accordance with embodiments of the present disclosure will now be described with reference to FIG. 7. The embodiment FIG. 7 provides time accurate references for the ANC system while providing both a low delay path for the ANC signal and a high-fidelity signal path for the reference audio signal. The system 700 may be implemented in noise cancelling headphones, ear buds, mobile phones or other systems that sense noise from an environment and generate a noise cancelling signal. The system 700 includes at least one microphone 702 or other audio sensor to sense the environmental noise from one or more noise sources and generate corresponding electrical signals representing the sensed noise. In various embodiments, the at least one microphone 702 may be arranged in a feed-forward, feedback, or combined feed forward/feed backward ANC system. The output of the microphone 702 may be a digital oversampled bit stream, e.g. the output from a single-bit digital microphone, or an analog signal that is provided to a preamplifier and a delta-sigma converter (single-bit or multi-bit) to produce the digital oversampled audio signal. The digital audio signal is decimated to a lower sample rate by a low delay decimator 704, such as a low power multi stage lattice wave filter of the present disclosure, for input to a low delay ANC processor 706.

The low delay ANC processor 706 generates an anti-noise signal corresponding to the environmental noise sensed by the microphone 702. The ANC processor 706 also receives a time-accurate downconverted (by 718), audio playback signal from the high-quality audio playback processor 708, which is used as an audio reference signal. In various embodiments, the ANC processor 706 uses a time or frequency update of internal filter nodes to adaptively filter the environmental noise from the microphone signal, which may also include desired audio played through a speaker 714. For example, the ANC processor 706 may implement a filtered-x least mean squares (FXLMS) algorithm to adaptively modify filter coefficients to filter out the environmental noise. To obtain a low latency, an adaptive filter topology is often used, and the filter updates may be performed in the frequency domain to obtain fast adaption even when there is a significant spread among the power spectrum of the noise. This enables fast adaptation even at frequencies where the energy content is significantly smaller than any dominant nodes by separating the signals in the frequency domain. An inverse frequency transform may be used to transform the adapted weights back to the time domain.

The audio playback processor 708 generates the desired audio signal (also referred to herein as the primary audio signal) for playback through an audio output, such as speaker 714. The desired audio signal may be generated from a source file (e.g., recorded music or movie file) or output from another source, such as a near end microphone or an audio signal received from a far end microphone in a voice over IP system. The desired audio signal is combined with the upconverted (by 720) anti-noise signal output by the ANC processor 706 by the adder 710. The summed output of these signals is filtered using a low latency interpolator 712 and output to the speaker 714 (sometimes called a receiver).

It will be appreciated that, for simplicity, some standard components are not shown in FIG. 7, for example, a microphone preamplifier, a possible microphone high voltage pump used in MEMS microphones, low noise power supply unit, speaker amplifier, a power source and other components of the system 700. These components are known to those skilled in the art and will be included in various practical system implementations but have been omitted here for clarity in the showing the processing path.

In various embodiments of the system 700, both the high-fidelity audio signal and the ANC output signals are represented at the same low sample rate (e.g. 192 kHz) and are therefore both subjected to the same low-fidelity interpolation filter—provided a low latency in the processing path is a design goal. While it is possible to increase the processing sample rate, this will increase power consumption and physical size of the design considerably. Therefore, it is desired to simultaneously be able to combine a high-quality interpolation filter for audio playback and a low latency filter path for the ANC processing (also referred to herein as the adaptive noise cancellation path) as illustrated in FIG. 7.

The high-quality audio playback processor 708 generates a high-quality audio signal which is fed to the high-quality interpolator 716 (i.e., a high-fidelity interpolation filter). To avoid problems with high power consumption, excessive complexity or differences in delays, this high-fidelity oversampled output of the high-quality interpolation filter is decimated by a factor of N by decimator 718 which operates without filtering (i.e., selects every Nth sample). Filtering (e.g., anti-aliasing) is not required because out-of-band signals are removed by the high-quality interpolator 716 and the signal bandwidth is therefore unchanged i.e. there is no aliasing. The ANC processor 706 output signal (anti-noise signal) is directly upsampled to a higher frequency in interpolator 720 by a factor of N to match the frequency of the high-quality audio signal. In one embodiment, the output signal is upsampled to a higher frequency by inserting N−1 samples equal to zero between each original sample. This operation will introduce multiple mirror aliases of the original noise signal. The anti-noise signal is combined with the high-fidelity oversampled output by adder 710, and the combined output signal is sent to the low delay interpolator 712.

The low delay interpolator 712 in this embodiment is an oversampled interpolator that operates at the higher sample rate of the initial audio output times N and removes the aliased images that will be output from the directly interpolated signal from the ANC processor 706, while the original oversampled high-fidelity oversampled audio signal will pass through unchanged since the aliased images have already been removed by the high-quality interpolator. The oversampled interpolator 712 may be implemented by adding extra delay elements inside each filter section, i.e. each filter section includes N, N/2. N/4 etc. times the original delay elements to obtain the same frequency response as the original filter configuration operating at N, N/2, N/4 times lower sample frequency. Example oversampled interpolator structures are described in co-pending U.S. application Ser. No. 16/177,308, filed Oct. 31, 2018, entitled LOW DELAY DECIMATOR AND INTERPOLATOR FILTERS, which is incorporated herein by reference.

Furthermore, this filter configuration solves practical implementation problems, because the filter elements are updated at the much higher sample rate of N times the original sample rate, thereby enabling an optimal group delay of the filters. In this case, the theoretical performance may be obtained without introducing extra delays due to a practical register transfer level implementation that often can give delays when transferring values between systems with different sample rates (i.e., difference sample frequencies).

In various embodiments, the oversampled interpolation filter has same input and output sample frequency and can also be used as a low latency decimation filter and thereby lower latency further by reducing the input path delay. It is essentially a low pass filter with very low delay and wide bandwidth, and it is possible to add a second decimation path for high-fidelity applications.

For various implementations, the filter may be optimized by first designing a filter with a response that may be ideal from an out-of-band attenuation point of view, and then further optimize the filter by adjusting the coefficients to improve the actual signal-to-noise-ratio (SNR) at the output of the filter, thereby taking the actual noise shaping of the used delta-sigma converters into account. Further, the coefficients may be discretized to remove multiplications in the actual implementation thus lowering silicon area, cost and power consumption significantly.

Figure 8:
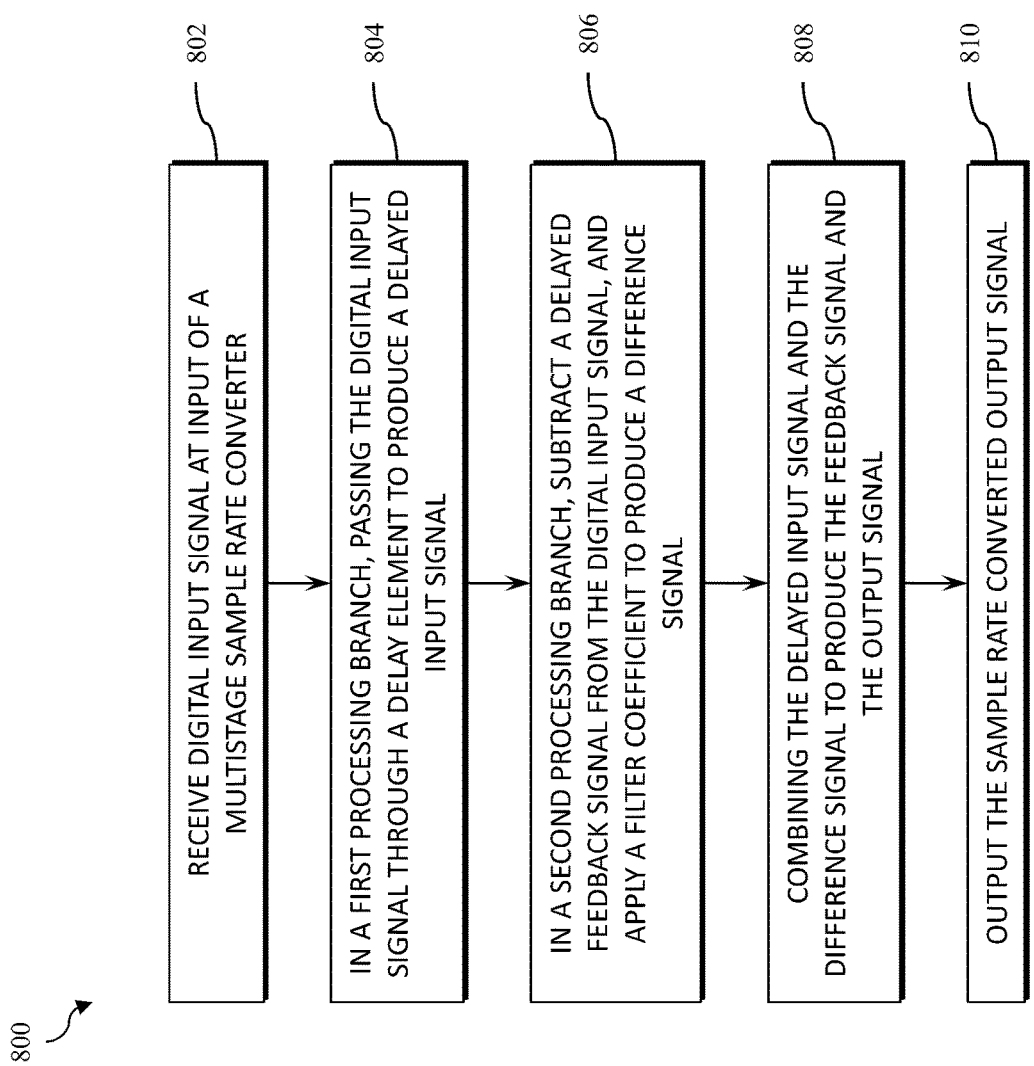
FIG. 8 is a flow diagram illustrating an example process for operating a low power lattice wave filter, in accordance with one or more embodiments of the present disclosure.

Referring to FIG. 8, an example process 800 in accordance with one or more embodiments will now be described. In step 802, a digital input signal is received at an input of a multistage sample rate converter. In some embodiments, the digital input signal may include any digital sampled signal, such as an audio signal in an audio processing system. In step 804, the digital input signal is passed through a delay element in a first processing branch to produce a delayed input signal. In step 806, in a second processing branch a delayed feedback signal is subtracted from the digital input signal, and a filter coefficient is applied to produce a difference signal. In step 808, the delayed input signal and the difference signal are combined to produce the feedback signal and the output signal. The sample rate converted output signal is output at step 810.

In the present disclosure, various structures of a low power, lattice wave filter have been presented. It will be appreciated that the embodiments disclosed herein are not limited to the topologies described but also include other topologies as will be understood by those having ordinary skill in the art.

Where applicable, various embodiments provided by the present disclosure may be implemented using hardware, software, or combinations of hardware and software. Also, where applicable, the various hardware components and/or logic components set forth herein may be combined into composite components comprising software, hardware, and/or both without departing from the scope of the present disclosure. Where applicable, the various hardware components and/or logic components set forth herein may be separated into sub-components comprising software, hardware, or both without departing from the scope of the present disclosure. In addition, where applicable, it is contemplated that software components may be implemented as hardware components and vice versa.

The foregoing disclosure is not intended to limit the present disclosure to the precise forms or particular fields of use disclosed. As such, it is contemplated that various alternate embodiments and/or modifications to the present disclosure, whether explicitly described or implied herein, are possible in light of the disclosure. For example, although the low delay decimators and low delay interpolators disclosed herein are described with reference to adaptive noise cancellation systems, it will be appreciated that the low delay filters disclosed herein may be used in other signal processing systems. Having thus described embodiments of the present disclosure, persons of ordinary skill in the art will recognize that changes may be made in form and detail without departing from the scope of the present disclosure. Thus, the present disclosure is limited only by the claims.

What is claimed is:

1. A system comprising:
a first filter stage of a multistage sample rate converter comprising:
an input operable to receive a digital input signal having a first sample rate;
a first processing branch including a first delay element operable to receive the digital input signal and output a delayed digital input signal;
a second processing branch including a first adder operable to receive the digital input signal and subtract a delayed feedback signal to produce a difference signal; and
a second adder operable to combine the delayed digital input signal and the difference signal to produce an output signal;
wherein the second processing branch further includes a feedback path including a second delay element operable to receive the output signal and output the delayed feedback signal;
a first register electrically coupled between the first filter stage and a second filter stage, wherein the first register is controlled by a first clock signal and wherein the first filter stage and the second filter stage are controlled by a second clock signal.

2. The system of claim 1, wherein the second processing branch further comprises a filter coefficient component, wherein an output of the first adder is provided to the filter coefficient component, and wherein filter coefficient component produces the difference signal.

3. The system of claim 1, wherein the first register delays the output signal between the first filter stage and the second filter stage to reduce ripple.

4. The system of claim 1, wherein the first filter stage and the second filter stage comprise a decimator.

5. The system of claim 1, wherein the first filter stage and the second filter stage comprise an interpolator.

6. The system of claim 1, wherein the first register is a D-type flip flop.

7. The system of claim 1, wherein the first clock signal is clocked on a skewed clock edge or an opposite signal edge than the second clock signal.

8. The system of claim 1, wherein the input further comprises an input node receiving the digital input signal; and wherein the system further comprises a first downsampler operable to receive the digital input signal from the input node, and downsample the digital input signal to the first sample rate.

9. The system of claim 8, wherein the system further comprises a third delay element coupled to receive the digital input signal and forward a second delayed digital input signal to a second downsampler operable to receive the second delayed digital input signal from the input node and downsample the second delayed digital input signal to the first sample rate;
wherein the system further comprises:
a third processing branch including a fourth delay element operable to receive the second delayed digital input signal and output a third delayed digital input signal;

a fourth processing branch including a third adder operable to receive the second digital input signal and subtract a second delayed feedback signal to produce a second difference signal;

a fifth adder operable to combine the third delayed digital input signal and the second difference signal to produce a second output signal; and wherein the fourth processing branch further includes a second feedback path including a fifth delay element operable to receive the second output signal and output the second delayed feedback signal.

10. The system of claim 9 further comprising a sixth adder operable to combine the output signal and the second output signal.

11. A method comprising:

receiving a digital input signal at a first filter stage of a multistage sample rate converter;

in a first processing branch of the first filter stage, delaying the digital input signal to produce a delayed digital input signal;

in a second processing branch of the first filter stage, subtracting a delayed feedback signal from the digital input signal to produce a difference signal;

combining the delayed input signal and the difference signal to produce an output signal from the first filter stage;

feeding back the output signal through a delay element to output the delayed feedback signal;

receiving the output signal at a first register electrically coupled between the first filter stage and a second filter stage;

controlling the first register with a first clock signal; and controlling the first filter stage and the second filter stage with a second clock signal.

12. The method of claim 11, further comprising, in the second processing branch, applying a filter coefficient to the difference signal to produce the difference signal.

13. The method of claim 11, wherein receiving the output signal at the first register comprises delaying the output signal between the first filter stage and the second filter stage to reduce ripple.

14. The method of claim 13, further comprising forwarding the output signal from the first register to a second filter stage.

15. The method of claim 14, wherein the first register is a D-type flip flop.

16. The method of claim 14, wherein the first clock signal is clocked on a skewed clock edge or an opposite signal edge than the second clock signal.

17. The method of claim 16, wherein the first register is triggered on a positive edge of the first clock.

18. The method of claim 17, wherein the second stage is triggered on a negative edge of the first clock.

19. The method of claim 18, wherein the method comprises a decimator and/or an interpolator process.

* * * * *